(12) United States Patent
Wang et al.

(10) Patent No.: US 11,799,008 B2
(45) Date of Patent: Oct. 24, 2023

(54) SEMICONDUCTOR DEVICE AND METHOD OF USING

(71) Applicants: TAIWAN SEMICONDUCTOR MANUFACTURING COMPANY, LTD., Hsinchu (TW); TSMC CHINA COMPANY, LIMITED, Songjiang (CN)

(72) Inventors: Ming Jian Wang, Hsinchu (TW); Xin Yong Wang, Hsinchu (TW); Cun Cun Chen, Hsinchu (TW); Jia Liang Zhong, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 28 days.

(21) Appl. No.: 17/174,920

(22) Filed: Feb. 12, 2021

(65) Prior Publication Data

US 2022/0238670 A1    Jul. 28, 2022

(30) Foreign Application Priority Data

Jan. 25, 2021 (CN) .......................... 202110096367.8

(51) Int. Cl.
  *H01L 29/423* (2006.01)
  *H01L 29/40* (2006.01)
  *H01L 27/088* (2006.01)

(52) U.S. Cl.
  CPC ........ *H01L 29/4238* (2013.01); *H01L 27/088* (2013.01); *H01L 29/402* (2013.01)

(58) Field of Classification Search
  CPC . H01L 29/4238; H01L 29/402; H01L 27/088; H01L 29/0607; H01L 29/0649;
  (Continued)

(56) References Cited

U.S. PATENT DOCUMENTS 5,886,388 A * 3/1999 Wada .................. H01L 27/1203
                                                  257/E27.099
2007/0241402 A1* 10/2007 Hirano ............. H01L 29/78609
                                                  257/E21.415
(Continued)

FOREIGN PATENT DOCUMENTS

CN        110364561 A  * 10/2019  ............. H01L 29/06

OTHER PUBLICATIONS

Wu et al., Semiconductor structure and forming method thereof, Oct. 22, 2019, machine translation of CN 110364561 A, pp. 1-5. (Year: 2019).*

(Continued)

*Primary Examiner* — Natalia A Gondarenko
(74) *Attorney, Agent, or Firm* — Hauptman Ham, LLP

(57) ABSTRACT

A semiconductor device includes a first doped region in a substrate, wherein the first doped region has a first dopant type. The semiconductor device further includes a second doped region in the substrate, wherein the second doped region has a second dopant type opposite the first dopant type. The semiconductor device further includes a silicide structure on the substrate, wherein the silicide structure includes a main body and a silicide extension. The semiconductor device further includes a plurality of first gate structures on the substrate, wherein a space between adjacent gate structures of the plurality of first gate structures includes a first area and a second area, the silicide extension extends into the first area, the first doped region is in the substrate below the first area, and the second doped region is in the substrate below the second area.

20 Claims, 8 Drawing Sheets

(58) Field of Classification Search
CPC .............. H01L 29/0696; H01L 29/0843; H01L 29/0865–0869; H01L 29/0882–0886; H01L 29/0891; H01L 29/1029–1058; H01L 29/41758; H01L 29/42312–42396; H01L 29/49–518; H01L 29/4975; H01L 29/4933; H01L 29/665–66507; H01L 21/28052; H01L 21/32053; H01L 21/32051; H01L 29/435; H01L 29/66848; H01L 29/8126; H01L 29/7841; H01L 29/1095; H01L 29/7725; H01L 29/775; H01L 29/778; H01L 29/7833–7836; H01L 29/8615; H01L 29/78624; H01L 29/78696; H01L 29/66598; H01L 29/66636; H01L 29/66643; H01L 29/66651; H01L 29/66659; H01L 27/11553; H01L 27/1158; H01L 27/1203; H01L 27/14616

USPC .... 257/401, 347, 57, 66, 349, 348; 438/165, 438/981

See application file for complete search history.

(56) References Cited

U.S. PATENT DOCUMENTS

| | | | |
|---|---|---|---|
| 2007/0296034 A1* | 12/2007 | Chen | H01L 27/115 257/E27.103 |
| 2008/0137394 A1* | 6/2008 | Shimano | G11C 11/4094 365/72 |
| 2019/0131133 A1* | 5/2019 | Smith | H01L 21/28097 |
| 2019/0198531 A1 | 6/2019 | Willard | |

OTHER PUBLICATIONS

Office Action dated May 23, 2022 for corresponding case No. TW 1112052530. (pp. 1-6).

* cited by examiner

A-A cross section

C-C cross section

B-B cross section

D-D cross section

US 11,799,008 B2

SEMICONDUCTOR DEVICE AND METHOD OF USING

PRIORITY CLAIM AND CROSS-REFERENCE

This application claims priority to Chinese Application No. 202110096367.8, filed Jan. 25, 2021, the entirety of which is hereby incorporated by reference.

BACKGROUND

Applying a bias voltage to a substrate helps to control a threshold voltage of devices manufactured on that substrate. The threshold voltage is the voltage level of a signal used to activate a transistor to transition from a non-conductive state to a conductive state. The bias voltage is usable to reduce the threshold voltage in some instances in order to utilize signals having a lower voltage for operating the device.

In order to reliably manufacture the devices, conductive structures in the device are enlarged in order to help ensure the formation of a conductive path regardless of offset errors during the manufacturing process. In some instances, an extrinsic gate is added to a gate structure in order to help pick up a bias voltage. An extrinsic gate is a conductive structure that expands the gate in two dimensions, i.e., a length and a width of the gate structure is increased by the inclusion of an extrinsic gate. The inclusion of an extrinsic gate increases the size of the overall gate structure. In addition, the extrinsic gate also is designed to satisfy design spacing rules, which determine how close different components of the device are able to be reliably manufactured. In some instances, the inclusion of the extrinsic gate structure results in the overall gate structure having an L-shape or a T-shape.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
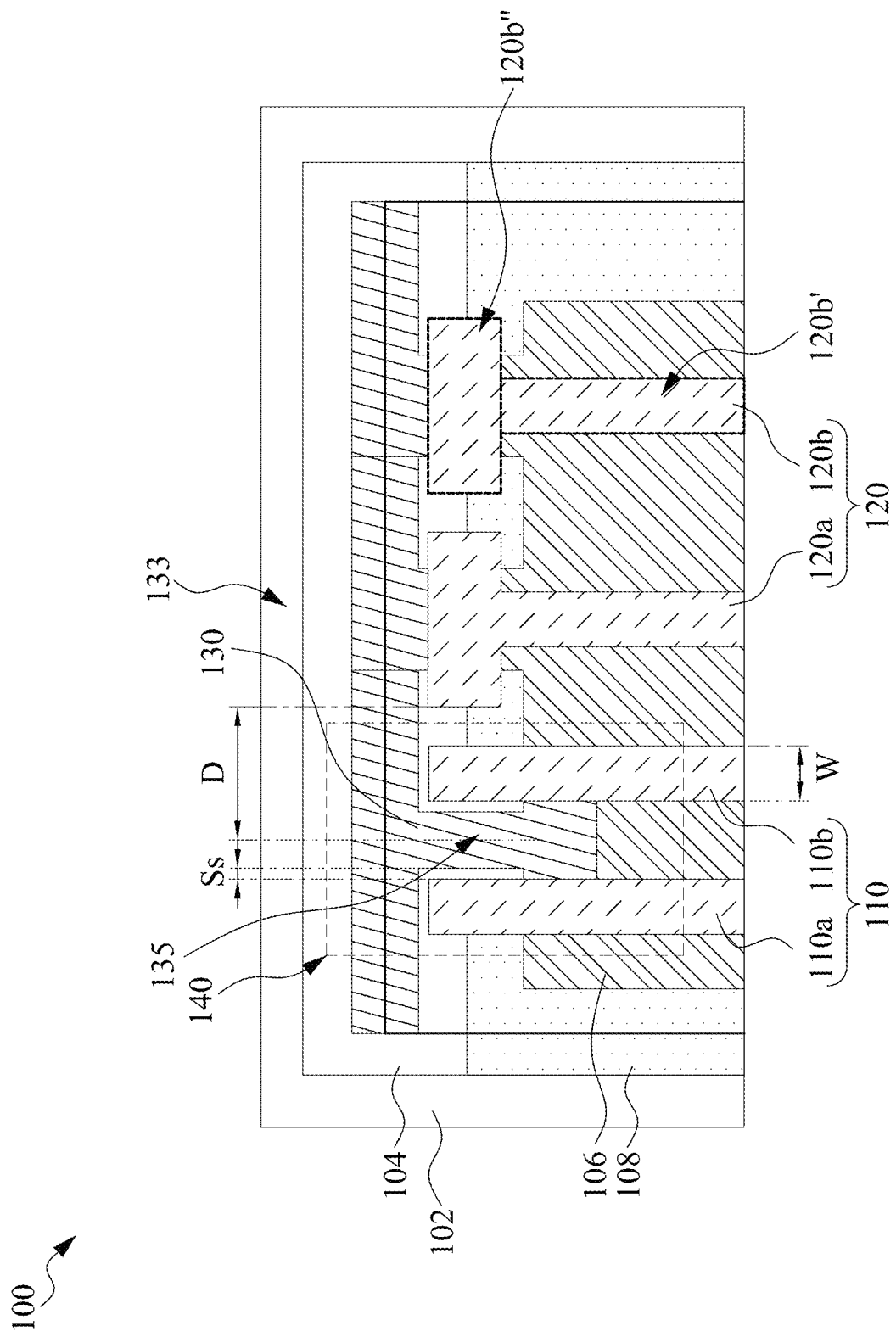
FIG. 1 is a top view of a semiconductor device in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, the inclusion of extrinsic gates in gate structures in order to help pick up bias voltages increases a size of a device. Not only does the extrinsic gate increase the size of the gate structure overall, but the design rule spacing for reliably manufacturing the extrinsic gate further increases the size of the device. In order to avoid the use of extrinsic gate structures in gate structures used to pick up the bias voltage, a silicide material is extended between adjacent pick up gate structures. In addition, a doped region also extends into the space between adjacent gate structures. By including the silicide region and the doped region between the adjacent gate structures, the bias voltage is reliably supplied to a bulk of the device and the overall size of the device is decreased. In some embodiments, the size reduction of the device ranges from about 13% to about 25% in comparison to devices that include extrinsic gate structures in the pick-up gate structures.

In addition, parasitic capacitance is reduced between the pick-up gate structures and other gate structures within the device. In some embodiments, parasitic capacitance is reduced by about 13% in comparison with devices that include extrinsic gate structures in the pick-up gate structures. Reducing the parasitic capacitance within the device helps the device to operate faster in comparison with devices having higher parasitic capacitance.

FIG. 1 is a top view of a semiconductor device 100 in accordance with some embodiments. The semiconductor device 100 is a metal-oxide-semiconductor (MOS) structure. The following description of semiconductor device 100 is based on a p-type MOS (PMOS) structure. However, one of ordinary skill in the art would recognize that the current disclosure is also applicable to an n-type MOS (NMOS) structure by changing dopant types in the following description.

The semiconductor device 100 includes an n-well 102 around a perimeter of the semiconductor device 100. An n-doped region 104 is in a substrate and extends across the semiconductor device 100 in a first direction. A p-doped region 106 is in the substrate and is spaced from the n-doped region 104. An isolation region 108 surrounds the p-doped region 106. A first pick-up gate structure 110a and a second pick-up gate structure 110b, collectively referred to as pick-up gate structures 110, extend in a second direction perpendicular to the first direction. The pick-up gate structures 110 extend over the p-doped region 106 and a portion of the n-doped region 104. A first operating gate structure 120a and a second operating gate structure 120b, collectively referred to as operating gate structures 120, are next to the pick-up gate structures 110. The second operating gate structure 120b includes an intrinsic portion 120b' and an extrinsic portion 120b". The extrinsic portion 120b" is an example of an extrinsic gate structure. The operating gate structures 120 extends over the p-doped region 106 and a portion of the n-doped region 104. The semiconductor device 100 further includes a silicide structure 130. The silicide structure 130 is over the n-doped region 104. The silicide structure 130 includes a main body 133 extending in the first direction over the n-doped region 104 away from the pick-up gate structures 110 and the operating gate structures 120. The silicide structure 130 further includes a silicide extension 135 that extends from the main body 133 to a region between the pick-up gate structures 110. The n-doped region 104 also extends into the region between the pick-up gate structures 110.

The n-well 102 is formed by implanting n-type dopants into a substrate to form a region of the substrate having n-type conductivity. In some embodiments, the implanted dopants include phosphorous, arsenic or another suitable n-type dopant. In some embodiments, a dopant concentration in the n-well 102 ranges from about $1\times10^{14}$ atoms/cm$^3$ to about $1\times10^{17}$ atoms/cm$^3$. If the dopant concentration is too high, then a risk of current leakage through the substrate increases, in some instances. If the dopant concentration is too high, then a bias voltage is unable to impact each of the devices formed on the substrate, in some instances.

The n-doped region 104 is also formed by implanting n-type dopants into the substrate. A concentration of n-type dopants in the n-doped region is higher than a concentration of n-type dopants in the n-well. The n-well 102 surrounds n-doped region 104. In some embodiments, a dopant concentration in the n-doped region 104 ranges from about $1\times10^{16}$ atoms/cm$^3$ to about $1\times10^{18}$ atoms/cm$^3$. If the dopant concentration is too high, then a risk of current leakage through the substrate increases, in some instances. If the dopant concentration is too high, then a bias voltage is unable to impact each of the devices formed on the substrate, in some instances. In some embodiments, a dopant in the n-well 102 is a same dopant as that in the n-doped region 104. In some embodiments, the dopant in the n-well 102 is different from the dopant in the n-doped region 104.

The n-doped region 104 extends between the pick-up gate structures 110. A portion of the n-doped region is exposed between each of the pick-up gate structures 110 and the silicide extension 135. In some embodiments, a spacing Ss between each of the pick-up gate structures 110 and the silicide extension 135 ranges from about 50 nanometers (nm) to about 100 nm. If the spacing Ss is too small, then a risk of the silicide extension 135 short circuiting to the pick-up gate structures 110 increases, in some instances. If the spacing Ss is too large, then the size of the semiconductor device 100 is increased without a noticeable increase in performance, in some instances.

The p-doped region 106 is formed by implanting p-type dopants into the substrate. The n-well 102 surrounds p-doped region 106. In some embodiments, the p-type dopants include boron, boron difluoride or another suitable p-type dopant. In some embodiments, a dopant concentration in the p-doped region 106 ranges from about $1\times10^{16}$ atoms/cm$^3$ to about $1\times10^{18}$ atoms/cm$^3$. If the dopant concentration is too high, then a risk of current leakage through the substrate increases, in some instances. If the dopant concentration is too high, then a bias voltage is unable to impact each of the devices formed on the substrate, in some instances.

In the top view, the p-doped region 106 is recessed in the second direction between the pick-up gate structures 110 to permit the n-doped region 104 and the silicide extension 135 to extend between the pick-up gate structures. The p-doped region 106 outside of the pick-up gate structures 110 is closer to the silicide main body 133 than the p-doped region between the pick-up gate structures 110.

The isolation region 108 provides electrical separation between the n-doped region 104 and the p-doped region 106 near the silicide structure 130. In some embodiments, the isolation region 108 is a shallow trench isolation (STI). In some embodiments, the isolation region 108 is formed by etching a portion of the substrate to form a recess and filling the recess with a dielectric material. In some embodiments, the isolation region 108 is formed by local oxidation of the substrate.

The pick-up gate structures 110 are configured to assist in coupling the bias voltage into the substrate. The pick-up gate structures 110 include only intrinsic gate structures without extrinsic gate structures. As a result, the pick-up gate structures 110 have an I-shape. A width W of the pick-up gate structures 110 remains constant along an entirety of the gate structures. In an upper region of pick-up gate structure 110a, a first edge of the pick-up gate structure 110a is aligned with the p-doped region 106 while a second edge, opposite the first edge, is aligned with the n-doped region 104. Similarly, in an upper region of pick-up gate structure 110b, a third edge of the pick-up gate structure 110b is aligned with the n-doped region 104 and a fourth edge, opposite the third edge, is aligned with the p-doped region 106. Both of the pick-up gate structures include an end region where both edges are aligned with the n-doped region 104, and a lower region where both edges are aligned with the p-doped region 106. In some embodiments, the pick-up gate structures 110 include polysilicon or metal. In some embodiments, the pick-up gate structures 110 include a gate dielectric material, for example, a high-k gate dielectric material.

The operating gate structures 120 are usable for implementing the functioning of the semiconductor device 100. That is, each of the operating gate structures 120 is usable to selectively electrically connect a corresponding source to a corresponding drain. A threshold voltage for selectively electrically connecting the corresponding source to the corresponding drain is determined in part based on the bias voltage coupled to the substrate near the pick-up gate structures 110. Each of the operating gate structures 120 includes both an intrinsic gate structure and an extrinsic gate structure. For example, operating gate structure 120b includes an intrinsic gate structure 120b' and an extrinsic gate structure 120b". The intrinsic gate structure 120b' helps with operation of the operating gate structure 120b. The extrinsic gate structure 120b" helps to isolate the corresponding source and drain. Due to the extrinsic gate structure, the operating gate structures 120 have a variable width. In some embodiments, the operating gate structures 120 include polysilicon or metal. In some embodiments, the operating gate structures 120 include a same material as the pick-up gate structures 110. In some embodiments, the operating gate structures 120 include a different material from the pick-up gate structures 110. In some embodiments, the operating gate structures 120 include a gate dielectric material, for example, a high-k gate dielectric material. In some embodiments, a gate dielectric material of the operating gate structures 120 is a same material as a gate dielectric material of the pick-up gate structures. In some embodiments, the gate dielectric material of the operating gate structures 120 is different from the gate dielectric material of the pick-up gate structures 110.

The silicide structure 130 extends over the n-doped region 104 to electrically connect to a bias voltage supply. The silicide structure 130 is formed by depositing a metal layer over the substrate and then annealing the semiconductor device 100. During the annealing, the silicon of the substrate reacts with the metal layer to form the silicide structure. In some embodiments, the silicide structure 130 is electrically connected to the bias voltage supply by an interconnect structure (not shown). In some embodiments, the silicide structure 130 is electrically connected to the bias voltage supply by a through substrate via (TSV) (not shown).

The silicide structure 130 includes the main body 133 extending in the first direction, and the silicide extension 135 extending in the second direction away from the main body 133. The main body 133 extends beyond the pick-up gate structures 110 and the operating gate structures 120 in the first direction.

The silicide extension 135 extends between the pick-up gate structures 110. A first portion of the silicide extension 135 is spaced from each of the pick-up gate structures 110 by a silicide spacing distance Ss. The silicide spacing distance Ss ranges from about 50 nanometers (nm) to about 100 nm. If the silicide spacing distance Ss is too small, then a risk of shorting the silicide structure to a conductive portion of the pick-up gate structures 110 increases, in some instances. If the silicide spacing distance Ss is too great, then a size of the semiconductor device 100 is increased without an increase in performance, in some instances. A second portion of the silicide extension 135 contacts each of the pick-up gate structures 110. The second portion of the silicide extension 135 is farther from the main body 133 than the first portion of the silicide extension 135. An edge of the silicide extension 135 farthest from the main body 133 is aligned with the p-doped region 106.

A distance D from a center of the silicide extension 135 to a closest edge of the operating gate structures 120 is reduced by about 30% in comparison to other structures which do not include the silicide extension 135. Overall, a size of the semiconductor device 100 is reduced by about 13% to about 25% in comparison to other structures which do not include the silicide extension 135. Further, each of the pick-up gate structures 110 has a parasitic capacitance reduction of about 13% in comparison with other structures where the pick-up gate structures include extrinsic gate structures.

Figure 2:
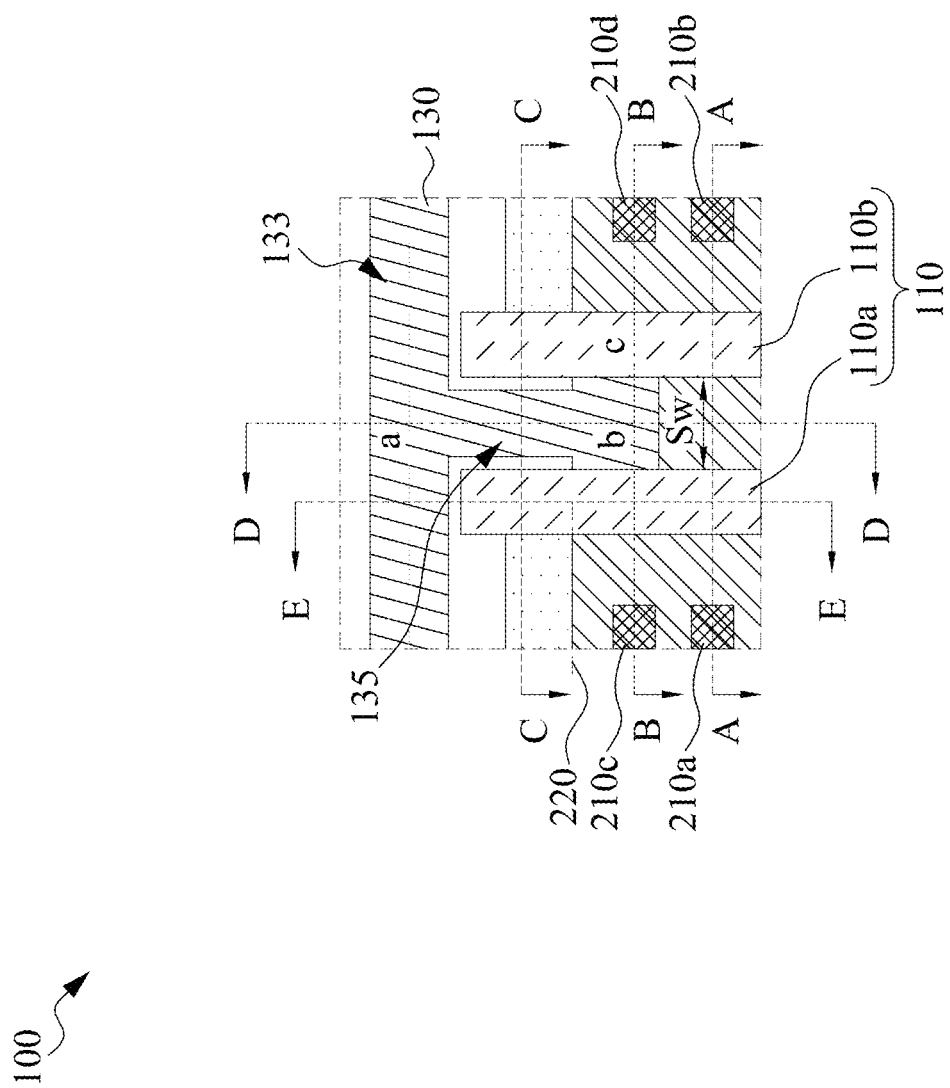
FIG. 2 is a top view of a portion of a semiconductor device in accordance with some embodiments.

FIG. 2 is a top view of a portion of the semiconductor device 100 in accordance with some embodiments. FIG. 2 is a top view of a zone 140 from FIG. 1 in some embodiments. In comparison with FIG. 1, FIG. 2 includes contacts 210a, 210b, 210c and 210d, collectively referred to as the contacts 210. The contacts 210 provide electrical connection between the corresponding source and drain regions of the pick-up gate structures and an interconnect structure (not shown). An interface line 220 is used to indicate where the isolation region 108 meets the p-doped region 106.

A width Sw of the silicide extension 135 between the pick-up gate structures 110 ranges from about 300 nm to about 400 nm. If the width Sw is too small, then an ability to reliably manufacture the semiconductor device decreases, in some instances. If the width Sw is too great, then the semiconductor device 100 is increased in size without significant improvement in performance, in some instances.

Positions a, b and c indicate a flow of a bias voltage through the silicide structure 130 and into the n-doped region 104 below the pick-up gate structures. This flow is also included in FIGS. 4 and 6, discussed below.

Figure 3:
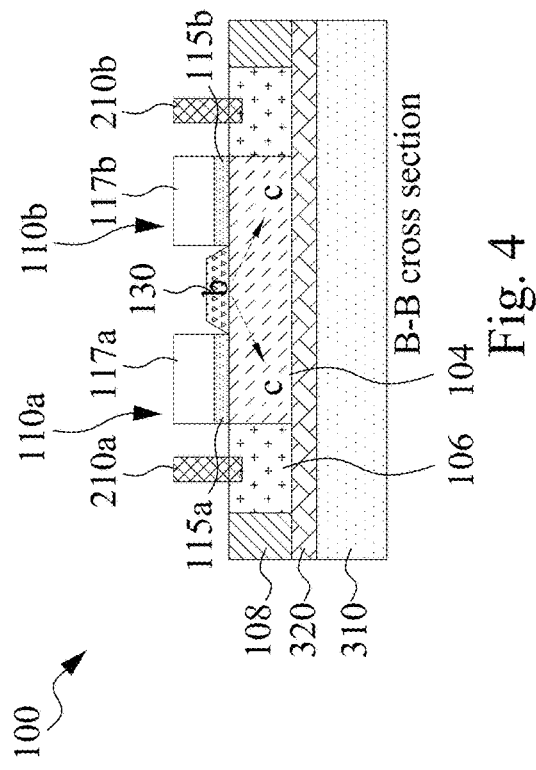
FIG. 3 is a cross-sectional view of a semiconductor device along a first cross-section in accordance with some embodiments.

FIG. 3 is a cross-sectional view of a portion of the semiconductor device 100 taken along line A-A of FIG. 2 in accordance with some embodiments. The semiconductor device 100 includes a bulk substrate 310. An insulating layer 320 is over the bulk substrate 310. The isolation region 108 surrounds the n-doped region 104 and the p-doped region 106 of the substrate. As discussed above, the n-doped region 104 and the p-doped region 106 are formed in a semiconductor layer, such as silicon. In some embodiments, the semiconductor device 100 is call a silicon-on-insulator (SOI) device.

The silicide structure 130 is on the p-doped region 106 between the pick-up gate structures 110. The contact 210a is electrically connected to the p-doped region 106 on a first side of the pick-up gate structure 110a opposite to the silicide structure 130. The contact 210b is electrically connected to the p-doped region 106 on a second side of the pick-up gate structure 110b opposite to the silicide structure 130.

Each of the pick-up gate structures 110 is over the n-doped region 104. The pick-up gate structure 110a includes a gate dielectric material 115a and a conductive layer 117a. In some embodiments, the gate dielectric material 115a includes a high-k dielectric material. In some embodiments, the conductive layer 117a includes polysilicon or metal. The pick-up gate structure 110b includes a gate dielectric material 115b and a conductive layer 117b. In some embodiments, the gate dielectric material 115b includes a high-k dielectric material. In some embodiments, the gate dielectric material 115b includes a same material as the gate dielectric material 115a. In some embodiments, the gate dielectric material 115b includes a different material from the gate dielectric material 115a. In some embodiments, the conductive layer 117b includes polysilicon or metal. In some embodiments, the conductive layer 117b includes a same material as the conductive layer 117a. In some embodiments, the conductive layer 117b includes a different material from the conductive layer 117b.

Figure 4:
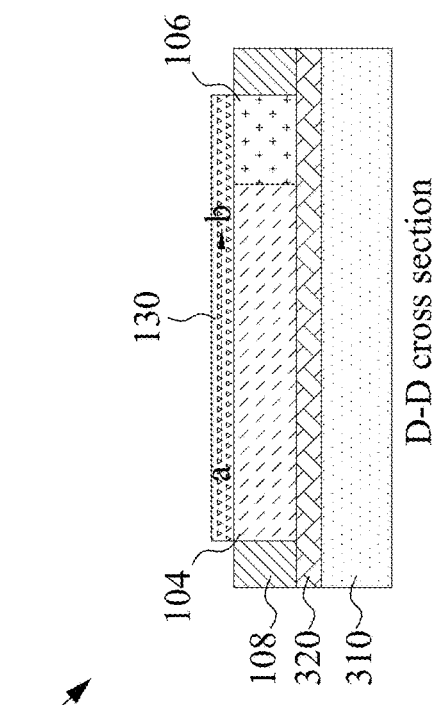
FIG. 4 is a cross-sectional view of a semiconductor device along a second cross-section in accordance with some embodiments.

FIG. 4 is a cross-sectional view of a portion of the semiconductor device 100 taken along line B-B of FIG. 2 in accordance with some embodiments. In comparison with FIG. 3, the silicide structure 130 is over the n-doped region 104 between the pick-up gate structures 110. The n-doped region 104 is continuous from under pick-up gate structure 110a to under pick-up gate structure 110b. The contact 210c is electrically connected to the p-doped region 106 on the first side of the pick-up gate structure 110a opposite to the silicide structure 130. The contact 210d is electrically connected to the p-doped region 106 on the second side of the pick-up gate structure 110b opposite to the silicide structure 130. The bias current flow from position b to position c will be discussed in detail below.

Figure 5:
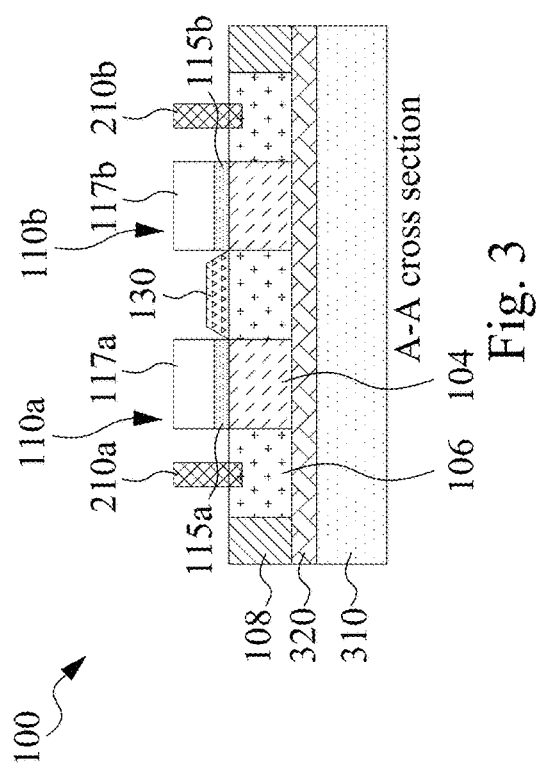
FIG. 5 is a cross-sectional view of a semiconductor device along a third cross-section in accordance with some embodiments.

FIG. 5 is a cross-sectional view of a portion of the semiconductor device 100 taken along line C-C of FIG. 2 in accordance with some embodiments. In comparison with FIG. 3, the silicide structure 130 is over the n-doped region 104 between the pick-up gate structures 110. Each of the pick-up gate structures 110 is over the isolation region 108.

Figure 6:
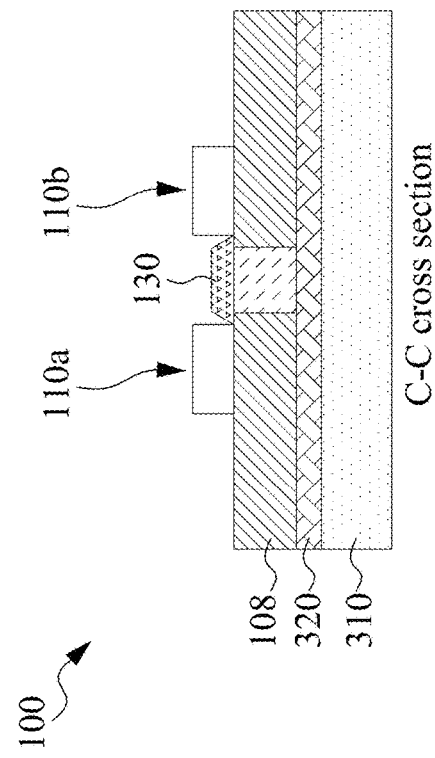
FIG. 6 is a cross-sectional view of a semiconductor device along a fourth cross-section in accordance with some embodiments.

FIG. 6 is a cross-sectional view of a portion of the semiconductor device 100 taken along line D-D of FIG. 2 in accordance with some embodiments. The silicide structure 130 extends over the n-doped region 104 and over the p-doped region 106. The portion of the silicide structure 130 over the n-doped region 104 is either the main body 133 (FIG. 1) or a portion of the silicide extension 135 near the main body 133. The bias current flow from position a to position b will be discussed in detail below.

Figure 7:
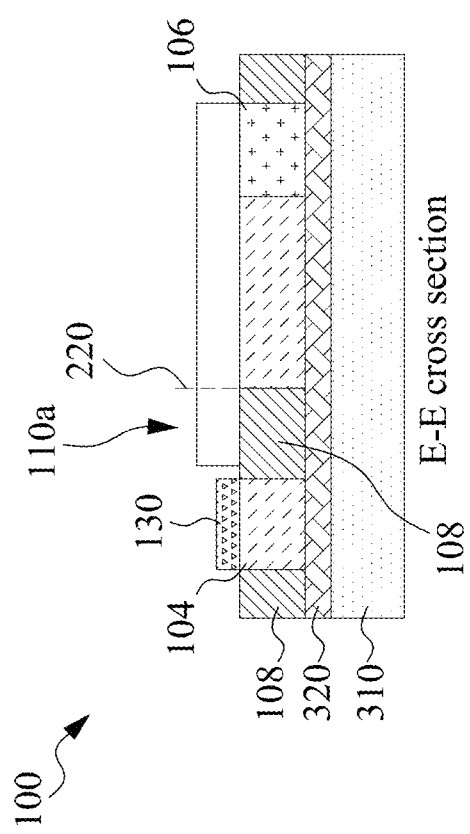
FIG. 7 is a cross-sectional view of a semiconductor device along a fifth cross-section in accordance with some embodiments.

FIG. 7 is a cross-sectional view of a portion of the semiconductor device 100 taken along line E-E of FIG. 2 in accordance with some embodiments. The silicide structure 130 is over the n-doped region 104. The portion of the silicide structure 130 in FIG. 7 is the main body 133. The silicide structure 130 is separated from the pick-up gate structure 110a. A first portion of the pick-up gate structure 110a beyond the interface line 220 is over the isolation region 108. A second portion of the pick-up gate structure 110a adjacent to the interface line 220 is over the n-doped region 104. A third portion of the pick-up gate structure 110a farther from the interface line 220 is over the p-doped region 106.

Returning to the bias voltage flow of FIGS. 4 and 6, the silicide structure 130 is electrically connected to the bias voltage supply. The bias voltage flows through an interconnect structure or TSV (not shown) to the silicide structure. The bias voltage travels along the main body 133 (FIG. 1) of the silicide structure to reach position a. As indicated in FIG. 2, the position a is at a location where the silicide extension 135 connects to the main body 133. The bias voltage then flows along the silicide extension 135 to position b, as indicated in FIG. 6. As indicated in FIG. 2, position b is a portion of the silicide extension 135 beyond the interface line 220. From position b, the bias voltage then flow into the substrate by entering the n-doped region 104 below the pick-up gate structures 110, as indicated in FIG. 4. By controlling the voltage in the n-doped region 104, the threshold voltage of the operating gate structures 120 (FIG. 1) are able to be controlled.

Figure 8:
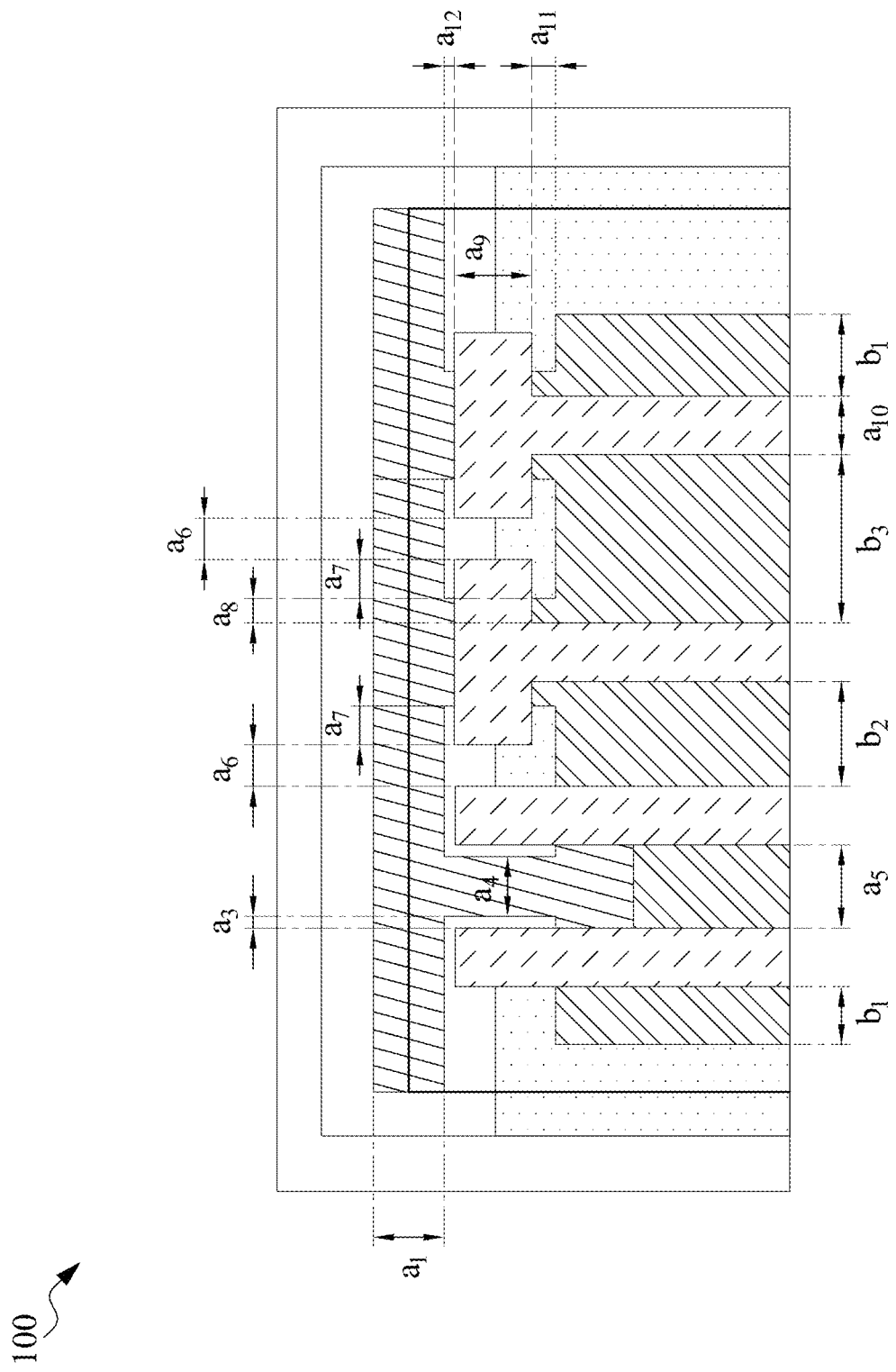
FIG. 8 is a top view of a semiconductor device in accordance with some embodiments.

FIG. 8 is a top view of a portion of the semiconductor device 100 in accordance with some embodiments. FIG. 8 is similar to FIG. 1. FIG. 8 is provided separate from FIG. 1 in order to provide information related to dimensions of the semiconductor device 100. The various components of the semiconductor device 100 are not labeled in FIG. 8 for the sake of clarity of the drawing.

In some embodiments, a width a1 of the main body 133 in the first direction ranges from about 200 nm to about 300 nm. If the width a1 is too small, then resistance of the main body 133 increases and the bias voltage applied to the substrate is reduced, in some instances. If the width a1 is too great, then a size of the semiconductor device 100 is increased without appreciable improvement in performance, in some instances.

In some embodiments, a distance a2 of the pick-up gate structures 110 beyond the p-doped region 106 ranges from about 140 nm to about 450 nm. If the distance a2 deviates too far from this range, then a length of the pick-up gate structures 110 in the first direction is significantly different from the length of the operating gate structures 120 and formation of the semiconductor device 100 becomes more complicated and a risk of error in manufacturing increases, in some instances.

In some embodiments, a distance a3 between an edge of the pick-up gate structures 110 and the silicide extension 135 ranges about 50 nm to about 100 nm. If the distance a3 is too small, then a risk of the silicide extension 135 short circuiting to the pick-up gate structures 110 increases, in some instances. If the distance a3 is too large, then the size of the semiconductor device 100 is increased without a noticeable increase in performance, in some instances.

In some embodiments, a width a4 of the silicide extension 135 that does not contact the pick-up gate structures 110 ranges from about 180 nm to about 240 nm. If the width a4 is too small, then resistance of the silicide extension 135 increases and the bias voltage applied to the substrate is reduced, in some instances. If the width a4 is too great, then a size of the semiconductor device 100 increase without appreciable improvement in performance, in some instances.

In some embodiments, a width a5 of the p-doped region 106 in the second direction between the pick-up gate structures 110 ranges from about 200 nm to about 280 nm. If the width a5 is too small, then the width a4 is also reduced and the resistance of the silicide structure 130 increases to an unacceptable level, in some instances. If the width a5 is too great, then the size of the semiconductor device 100 is increased without an appreciable improvement in performance, in some instances.

In some embodiments, a distance a6 between the pick-up gate structure 110b and the extrinsic gate of the operating gate structure 120a in the second direction ranges from about 140 nm to about 240 nm. If the distance a6 is too small, then the pick-up gate structure 110b and the operating gate structure 120a cannot be manufactured reliably, in some instances. If the distance a6 is too great, then the size of the semiconductor device 100 is increased without appreciable improvement in performance, in some instances.

In some embodiments, a distance a7 in which the extrinsic gate extends beyond the p-doped region 106 in the second direction ranges from about 140 nm to about 240 nm. If the distance a7 is too small, then extrinsic gate fails to provide sufficient isolation between the corresponding source and drain, in some instances. If the distance a7 is too great, then the size of the semiconductor device 100 is increased without appreciable improvement in performance, in some instances.

In some embodiments, a distance a8 in which the extrinsic gate extends overlaps the p-doped region 106 in the second direction ranges from about 75 nm to about 150 nm. If the distance a8 is too small, an interface between the operating gate structures 120 and the silicide structure 130 is reduced, in some instances. If the distance a8 is too great, then the size of the semiconductor device 100 is increased without appreciable improvement in performance, in some instances.

In some embodiments, a width a9 of the extrinsic gate of the operating gate structures 120 in the first direction ranges from about 240 nm to about 300 nm. If the width a9 is too small, then extrinsic gate fails to provide sufficient isolation between the corresponding source and drain, in some instances. If the width a9 is too great, then the size of the semiconductor device 100 is increased without appreciable improvement in performance, in some instances.

In some embodiments, a width a10 of the intrinsic gate of the operating gate structures 120 in the second direction ranges from about 180 nm to about 280 nm. If the width a10 is too small, then intrinsic gate fails to provide sufficient isolation between the corresponding source and drain, in some instances. If the width a10 is too great, then the operating speed of the semiconductor device 100 is reduced, in some instances.

In some embodiments, a distance a11 between an outer portion of the extrinsic gate and the p-doped region 106 in the first direction ranges from about 50 nm to about 150 nm. If the distance a11 is too small, then extrinsic gate fails to provide sufficient isolation between the corresponding source and drain, in some instances. If the distance a11 is too great, then the size of the semiconductor device 100 is increased without appreciable improvement in performance, in some instances.

In some embodiments, a distance a12 between an outer portion of the extrinsic gate and the main body 133 in the first direction ranges from about 50 nm to about 100 nm. If the distance a12 is too small, then a risk of the extrinsic gate shorting to the silicide structure 130 increases, in some instances. If the distance a12 is too great, then the size of the semiconductor device 100 is increased without appreciable improvement in performance, in some instances.

In some embodiments, a distance b1 between an outer edge of the pick-up gate structure 110a and an outer edge of the p-doped region 106 in the second direction ranges from about 280 nm to about 350 nm. If the distance b1 is too small, then a size of a source or drain in the p-doped region 106 is reduced and resistance for a current through the contacts 210 increases, in some instances. If the distance b1 is too great, then the size of the semiconductor device 100 is increased without appreciable improvement in performance, in some instances.

In some embodiments, a distance b2 between an outer edge of the pick-up gate structure 110b and an intrinsic gate of the operating gate structure 120a in the second direction ranges from about 350 nm to about 500 nm. If the distance b2 is too small, then the pick-up gate structure 110b and the operating gate structure 120a cannot be manufactured reliably, in some instances. If the distance b2 is too great, then the size of the semiconductor device 100 is increased without appreciable improvement in performance, in some instances.

In some embodiments, a distance b3 between an intrinsic gate of the operating gate structure 120b and an intrinsic gate of the operating gate structure 120a in the second direction ranges from about 600 nm to about 750 nm. If the distance b3 is too small, then the operating gate structures 120 cannot be manufactured reliably, in some instances. If the distance b3 is too great, then the size of the semiconductor device 100 is increased without appreciable improvement in performance, in some instances.

Figure 9:
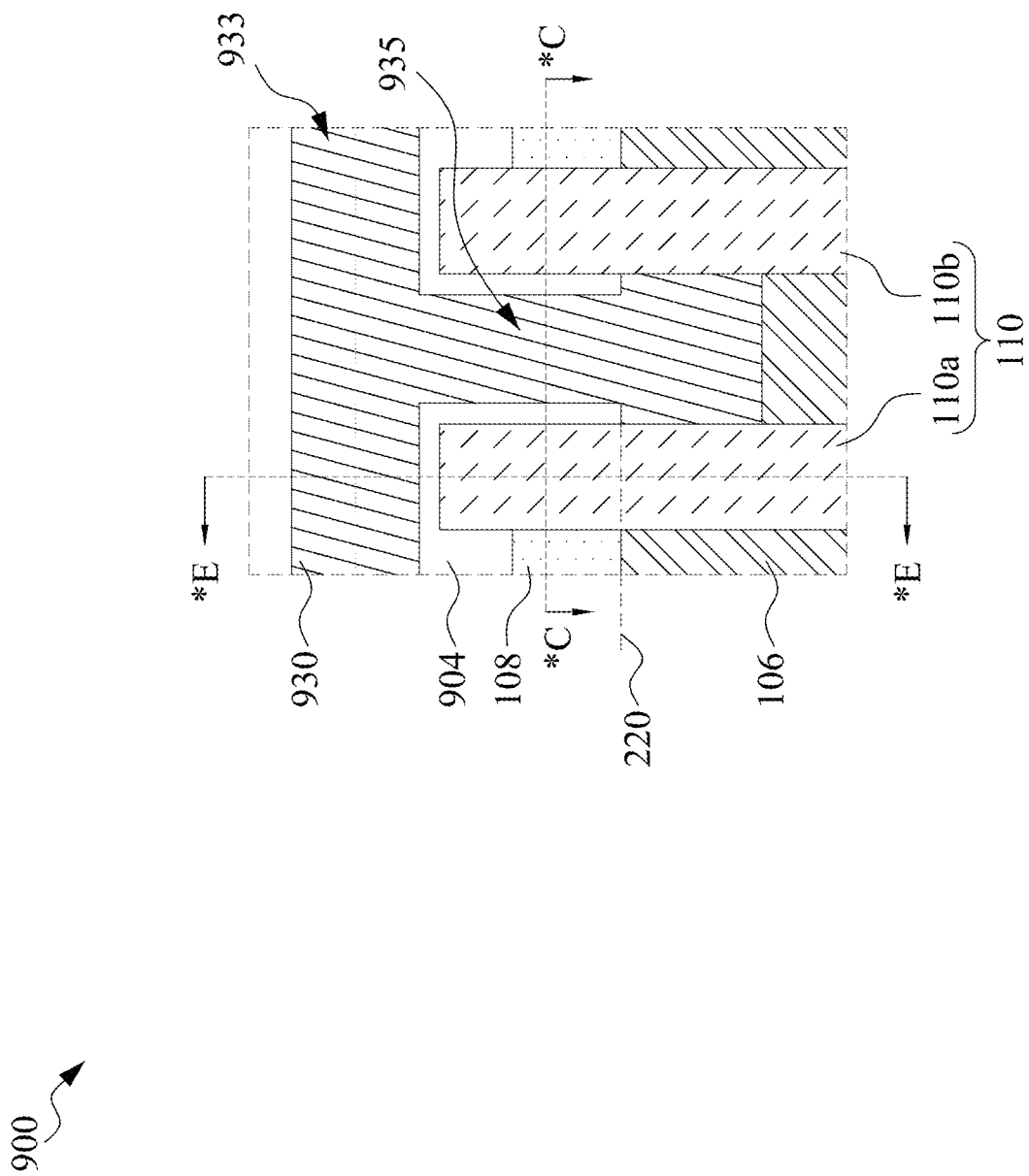
FIG. 9 is a top view of a portion of a semiconductor device in accordance with some embodiments.

FIG. 9 is a top view of a portion of a semiconductor device 900 in accordance with some embodiments. The semiconductor device 900 is similar to the semiconductor device 100 (FIG. 1). Description of components of the semiconductor device 900 that are similar to the semiconductor device 100 is omitted for the sake of brevity. Unless otherwise noted, dimensions of the semiconductor device 900 are similar to the dimension of the semiconductor device 100, as described above with respect to FIG. 8. FIG. 9 is a top view of a portion of the semiconductor device 900 similar to the zone 140 from FIG. 1 in some embodiments. In comparison with FIG. 2, the silicide structure 930 of FIG. 9 includes a main body 933 and a silicide extension 935 which completely fills a space between the pick-up gate structures 110. While the main body 933 remains separated from the pick-up gate structures 110, the silicide extension 935 contacts an edge of the pick-up gate structures 110 adjacent to the main body 933. A composition of n-doped region 904 is similar to the composition of the n-doped region 104 described above. A composition of the silicide structure 930 is similar to the composition of the silicide structure 130 described above.

Figure 10:
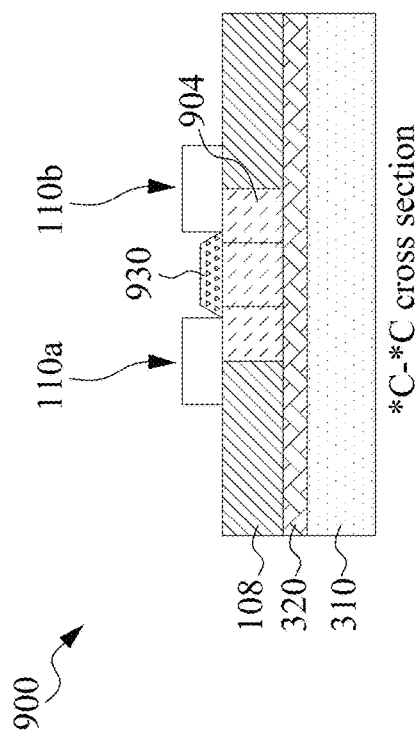
FIG. 10 is a cross-sectional view of a semiconductor device along a first cross-section in accordance with some embodiments.

FIG. 10 is a cross-sectional view of a portion of the semiconductor device 900 taken along line *C-*C of FIG. 9 in accordance with some embodiments. In comparison with FIG. 5, the n-doped region 904 extends below both of the pick-up gate structures 110.

Figure 11:
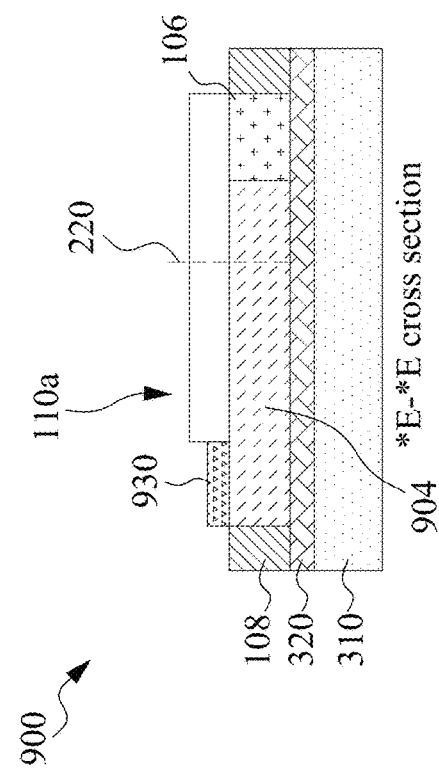
FIG. 11 is a cross-sectional view of a semiconductor device along a second cross-section in accordance with some embodiments.

FIG. 11 is a cross-sectional view of a portion of the semiconductor device 900 taken along line *E-*E of FIG. 9 in accordance with some embodiments. In comparison with FIG. 7, the n-doped region 904 extends below the pick-up gate structure 110a closest to the main body 933 (FIG. 9). In addition, the silicide extension 935 directly contacts the pick-up gate structure 110a.

In comparison with the semiconductor device 100, the semiconductor device 900 is able to provide faster transfer of the bias voltage from the bias voltage supply to the substrate. The increased size of the silicide structure 930 in comparison with the silicide structure 130 reduces resistance to the flow of the bias voltage. The increased size of the n-doped region 904 also helps to supply the bias voltage to different areas of the semiconductor device 900 with reduced isolation from the isolation region 108 (FIG. 1).

Figure 12:
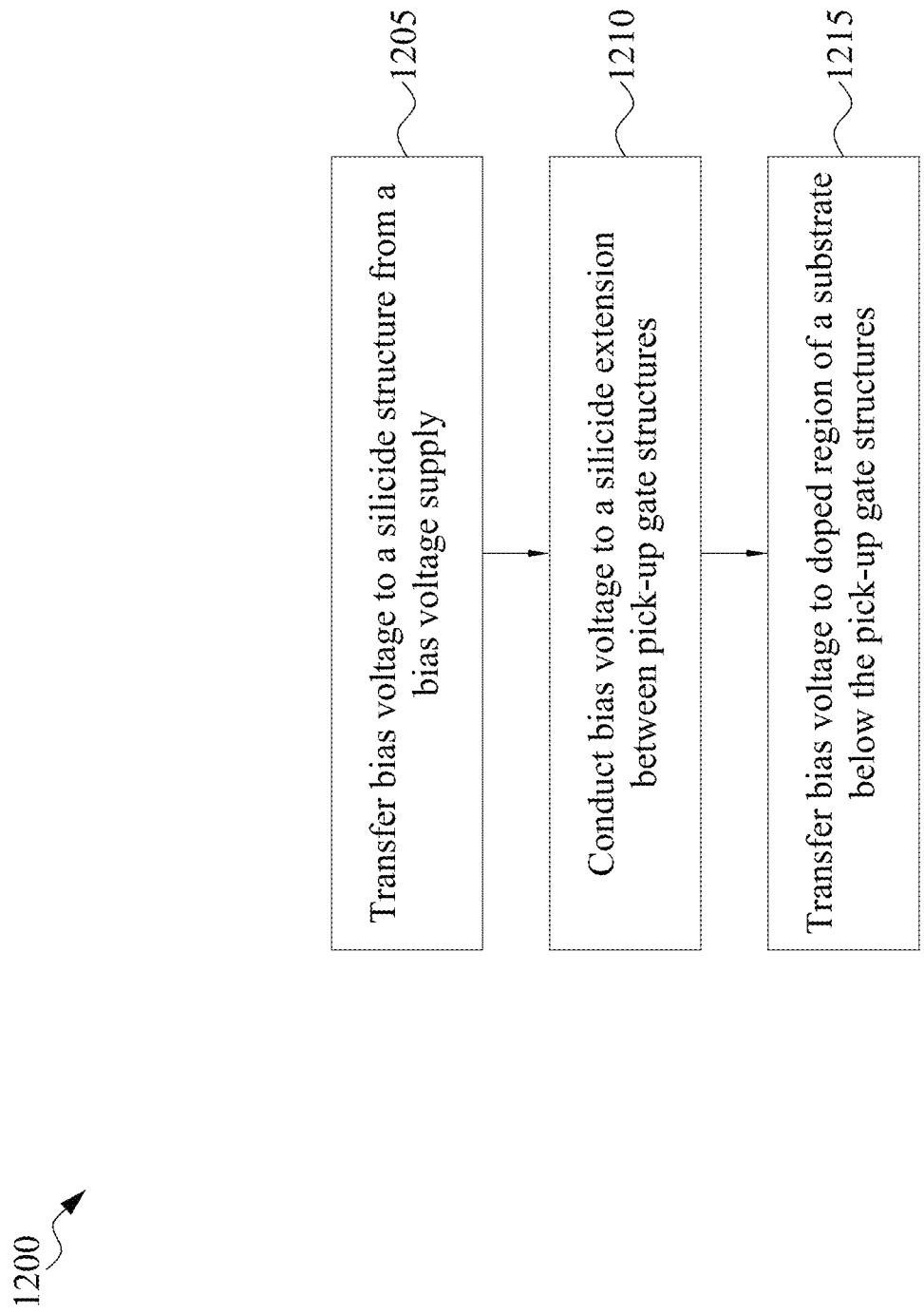
FIG. 12 is a flow chart of a method of using a semiconductor device in accordance with some embodiments.

FIG. 12 is a flow chart of a method 1200 of using a semiconductor device in accordance with some embodiments. In some embodiments, the method 1200 is implemented using the semiconductor device 100 or the semiconductor device 900.

In operation 1205, a bias voltage is transferred to a silicide structure form a bias voltage supply. In some embodiments, the bias voltage supply is a bus carrying a source voltage, e.g., VDD. In some embodiments, the bias voltage is transferred to the silicide structure using an interconnect structure. In some embodiments, the bias voltage is transferred to the silicide structure using a TSV. In some embodiments, transfer of the bias voltage to the silicide structure is controlled by at least one transistor in order to control the amount of bias voltage provided to the substrate in order to tune the threshold voltage of elements within the semiconductor device.

In operation 1210, the bias voltage is conducted along the silicide structure to a silicide extension between pick-up gate structures. The silicide extension is integral with the silicide structure. The silicide structure extends between pick-up gate structures. In some embodiments, a first portion of the silicide extension between the pick-up gate structures is spaced from the pick-up gate structures; and a second portion of the silicide extension between the pick-up gate structures directly contacts the pick-up gate structures. In some embodiments, an entirety of the silicide extension between the pick-up gate structures directly contacts the pick-up gate structures. In some embodiments, the silicide extension directly contacts an edge of the pick-up gate structures closest to a main body of the silicide structure.

In operation 1215, the bias voltage is transferred from the silicide extension into a doped region of a substrate below the pick-up gate structures. In some embodiments, the doped region includes an n-doped region. In some embodiments, the substrate is an SOI substrate. In some embodiments, the doped region is directly beneath the pick-up gate structures only in a location where the pick-up gate structures are in direct contact with the silicide extension. In some embodiments, the doped region is directly beneath the pick-up gate structures along an entirety of the pick-up gate structures.

An aspect of this description relates to a semiconductor device. The semiconductor device includes a first doped region in a substrate, wherein the first doped region has a first dopant type. The semiconductor device further includes a second doped region in the substrate, wherein the second doped region has a second dopant type opposite the first dopant type. The semiconductor device further includes a silicide structure on the substrate, wherein the silicide structure includes a main body and a silicide extension. The semiconductor device further includes a plurality of first gate structures on the substrate, wherein a space between adjacent gate structures of the plurality of first gate structures includes a first area and a second area, the silicide extension extends into the first area, the first doped region is in the substrate below the first area, and the second doped region is in the substrate below the second area. In some embodiments, each of the plurality of first gate structures has an I-shape. In some embodiments, the semiconductor device further includes a plurality of second gate structures, wherein each of the plurality of second gate structures has a T-shape. In some embodiments, the silicide extension includes a first portion in direct contact with the adjacent gate structures of the plurality of first gate structures. In some embodiments, the silicide extension includes a second portion spaced from each of the adjacent gate structures of the plurality of first gate structures. In some embodiments, the silicide extension directly contacts an edge of each of the plurality of first gate structures, and the edge is a closest edge of each of the plurality of first gate structures to the main body. In some embodiments, the semiconductor device further includes an isolation region in the substrate, wherein the isolation region directly contacts the second doped region at an interface. In some embodiments, a portion of each of the plurality of first gate structures extending beyond the interface is over the isolation region. In some embodiments, a portion of each of the plurality of first gate structures extending beyond the interface is over the first doped region.

An aspect of this description relates to a semiconductor device. The semiconductor device includes an n-doped region in a substrate. The semiconductor device further includes a p-doped doped region in the substrate. The semiconductor device further includes a silicide structure over the n-doped region, wherein the silicide structure includes a main body and a silicide extension. The semiconductor device further includes a plurality of first gate structures on the substrate, wherein the n-doped region extends into a space of the substrate exposed by adjacent gate structures of the plurality of first gate structures, and the silicide extension extends between the adjacent gate structures of the plurality of first gate structures. In some embodiments, a width of the silicide extension between the adjacent gate structures of the plurality of first gate structures is constant. In some embodiments, a width of the silicide extension between the adjacent gate structures of the plurality of first gate structures is variable. In some embodiments, the silicide extension directly contacts each of the plurality of first gate structures along an entire edge adjacent to the space. In some embodiments, the silicide extension is spaced from a portion of an edge of each of the plurality of first gate structures adjacent to the space. In some embodiments, the semiconductor device further includes a plurality of second gate structures on the substrate. In some embodiments, each of the plurality of second gate structures has a T-shape, and each of the plurality of first gate structures has an I-shape.

An aspect of this description relates to a method of biasing a substrate. The method includes electrically connecting a silicide structure to a bias voltage supply. The method further includes conducting a bias voltage received by the silicide structure to a silicide extension extending from a main body of the silicide structure, wherein the silicide extension extends between adjacent gate structures of a plurality of first gate structures. The method further includes transferring the bias voltage from the silicide extension into a doped region of a substrate below the adjacent gate structures of the plurality of first gate structures. In some embodiments, electrically connecting the silicide structure to the bias voltage supply includes electrically connecting the silicide structure to the bias voltage supply using an interconnect structure. In some embodiments, electrically connecting the silicide structure to the bias voltage supply includes electrically connecting the silicide structure to the bias voltage supply using a through silicon via (TSV). In some embodiments, transferring the bias voltage to into the doped region includes transferring the bias voltage to the doped region from a portion of the silicide extension in direct contact with each of the plurality of first gate structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first doped region in a substrate, wherein the first doped region has a first dopant type;
   a second doped region in the substrate, wherein the second doped region has a second dopant type opposite the first dopant type;
   an isolation structure between the first doped region and the second doped region;
   a silicide structure on the substrate, wherein the silicide structure comprises a main body and a silicide extension, and the main body is integral with the silicide extension; and
   a plurality of first gate structures on the substrate, wherein each of the plurality of first gate structures continuously extending over the first doped region and the second doped region, a space between adjacent gate structures of the plurality of first gate structures comprises a first area and a second area, the silicide extension extends into the first area, the first doped region is in the substrate below the first area, and the second doped region is in the substrate below the second area.

2. The semiconductor device of claim 1, wherein each of the plurality of first gate structures has an I-shape.

3. The semiconductor device of claim 1, further comprising a plurality of second gate structures, wherein each of the plurality of second gate structures has a T-shape.

4. The semiconductor device of claim 1, wherein the silicide extension comprises a first portion in direct contact with the adjacent gate structures of the plurality of first gate structures.

5. The semiconductor device of claim 4, wherein the silicide extension comprises a second portion spaced from each of the adjacent gate structures of the plurality of first gate structures.

6. The semiconductor device of claim 1, wherein the silicide extension directly contacts an edge of each of the plurality of first gate structures, and the edge is a closest edge of each of the plurality of first gate structures to the main body.

7. The semiconductor device of claim 1, wherein the isolation region directly contacts the second doped region at an interface.

8. The semiconductor device of claim 7, wherein a portion of each of the plurality of first gate structures extending beyond the interface is over the isolation region.

9. The semiconductor device of claim 7, wherein a portion of each of the plurality of first gate structures extending beyond the interface is over the first doped region.

10. A semiconductor device comprising:
an n-doped region in a substrate;
a p-doped doped region in the substrate;
a silicide structure over the n-doped region, wherein the silicide structure comprises a main body and a silicide extension; and
a plurality of first gate structures on the substrate, wherein each of the plurality of first gate structures continuously extending over the n-doped region and the p-doped region, the n-doped region extends into a space of the substrate exposed by adjacent gate structures of the plurality of first gate structures, the silicide extension extends between the adjacent gate structures of the plurality of first gate structures in a direction parallel to a top surface of the substrate in a cross-sectional view, and the silicide extension has a non-uniform width in a plan view.

11. The semiconductor device of claim 10, wherein a width of the silicide extension between the adjacent gate structures of the plurality of first gate structures is constant.

12. The semiconductor device of claim 10, wherein a width of the silicide extension between the adjacent gate structures of the plurality of first gate structures is variable.

13. The semiconductor device of claim 10, wherein the silicide extension directly contacts each of the plurality of first gate structures along an entire edge adjacent to the space.

14. The semiconductor device of claim 10, wherein the silicide extension is spaced from a portion of an edge of each of the plurality of first gate structures adjacent to the space.

15. The semiconductor device of claim 10, further comprising a plurality of second gate structures on the substrate.

16. The semiconductor device of claim 15, wherein each of the plurality of second gate structures has a T-shape, and each of the plurality of first gate structures has an I-shape.

17. A semiconductor device comprising:
a first doped region in a substrate, wherein the first doped region has a first dopant type;
a second doped region in the substrate, wherein the second doped region has a second dopant type opposite the first dopant type;
an isolation structure in the substrate;
a silicide structure on the substrate, wherein the silicide structure comprises a main body and a silicide extension, wherein the main body is integral with the silicide extension, the silicide extension extends over the first doped region, and the main body continuously extends over the first doped region and the second doped region; and
a gate structure on the substrate, wherein the gate structure continuously extends over the first doped region, the second doped region, and the isolation structure, the gate structure extends parallel to the silicide extension, and the gate structure extends perpendicular to the main body.

18. The semiconductor device of claim 17, wherein a portion of the gate structure over the isolation structure is spaced from the silicide extension in a first direction parallel to a top surface of the substrate.

19. The semiconductor device of claim 18, wherein a portion of the first doped region is between the second doped region and the isolation structure in the first direction.

20. The semiconductor device of claim 17, wherein the main body extends in a direction perpendicular to the silicide extension.

* * * * *